US010629526B1

(12) United States Patent
Hill

(10) Patent No.: US 10,629,526 B1
(45) Date of Patent: Apr. 21, 2020

(54) TRANSISTOR WITH NON-CIRCULAR VIA CONNECTIONS IN TWO ORIENTATIONS

(71) Applicant: NXP USA, Inc., Austin, TX (US)

(72) Inventor: Darrell Glenn Hill, Chandler, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 16/157,349

(22) Filed: Oct. 11, 2018

(51) Int. Cl.
| | | |
|---|---|---|
| H01L 23/52 | (2006.01) |
| H01L 23/48 | (2006.01) |
| H01L 23/66 | (2006.01) |
| H01L 25/07 | (2006.01) |
| H01L 29/41 | (2006.01) |
| H01L 29/423 | (2006.01) |
| H03F 1/02 | (2006.01) |
| H01L 23/522 | (2006.01) |
| H01L 23/528 | (2006.01) |
| H01L 29/417 | (2006.01) |
| H01L 23/482 | (2006.01) |
| H03F 3/193 | (2006.01) |
| H03F 3/21 | (2006.01) |

(52) U.S. Cl.
CPC ...... *H01L 23/5226* (2013.01); *H01L 23/4824* (2013.01); *H01L 23/5283* (2013.01); *H01L 23/66* (2013.01); *H01L 25/072* (2013.01); *H01L 29/41758* (2013.01); *H01L 29/42376* (2013.01); *H03F 1/0288* (2013.01); *H01L 2223/6655* (2013.01); *H03F 3/193* (2013.01); *H03F 3/211* (2013.01); *H03F 2200/222* (2013.01); *H03F 2200/318* (2013.01); *H03F 2200/387* (2013.01); *H03F 2200/451* (2013.01); *H03F 2203/21103* (2013.01); *H03F 2203/21139* (2013.01)

(58) Field of Classification Search
CPC ............ H01L 23/5226; H01L 23/4824; H01L 23/5283; H01L 23/66; H01L 25/072; H01L 29/41758; H01L 29/42376; H03F 1/0288
See application file for complete search history.

(56) References Cited

U.S. PATENT DOCUMENTS 4,462,041 A * 7/1984 Glenn ................. H01L 29/0692
257/401
5,734,189 A 3/1998 Pribble
(Continued)

FOREIGN PATENT DOCUMENTS

EP 2133909 A1 12/2009

*Primary Examiner* — Ida M Soward
(74) *Attorney, Agent, or Firm* — Charlene R. Jacobsen

(57) ABSTRACT

A transistor includes an active region bounded by an outer periphery and formed in a substrate. The active region includes sets of input fingers, output fingers, and common fingers disposed within the substrate and oriented substantially parallel to one another. The transistor further includes an input port, an output port, a first via connection disposed at the outer periphery of the active region proximate the input port and a second via connection disposed at the outer periphery of the active region proximate the output port. The second via connection has a noncircular cross-section with a second major axis and a second minor axis, the second major axis having a second major axis length, the second minor axis having a second minor axis length that is less than the second major axis length. The second major axis is oriented parallel to a longitudinal dimension of the input, output, and common fingers.

15 Claims, 4 Drawing Sheets

(56) References Cited

U.S. PATENT DOCUMENTS

| | | | | |
|---|---|---|---|---|
| 5,818,077 A * | 10/1998 | Takahashi | H01L 29/4175 | 257/276 |
| 6,252,266 B1 | 6/2001 | Hoshi et al. | | |
| 6,900,482 B2 * | 5/2005 | Aoki | H01L 29/0692 | 257/256 |
| 7,312,482 B2 * | 12/2007 | Nakajima | H01L 23/3107 | 257/157 |
| 7,511,575 B2 * | 3/2009 | Gotou | H03F 3/211 | 330/124 R |
| 7,560,346 B2 * | 7/2009 | Igarashi | H01L 27/0207 | 257/319 |
| 7,741,683 B2 * | 6/2010 | Ahn | H01L 29/41758 | 257/401 |
| 7,928,809 B2 * | 4/2011 | Miyashita | H03B 5/1228 | 257/401 |
| 8,097,906 B2 * | 1/2012 | Takagi | H01L 23/4824 | 257/287 |
| 8,710,928 B2 * | 4/2014 | Ng | H01L 29/4175 | 330/295 |
| 8,796,697 B2 * | 8/2014 | Kunii | H01L 23/66 | 257/77 |
| 8,816,393 B2 * | 8/2014 | Yamamura | H01L 29/2003 | 257/192 |
| 9,006,799 B2 * | 4/2015 | Vorhaus | H01L 27/0207 | 257/256 |
| 9,153,580 B2 * | 10/2015 | Mitomo | H01L 23/5228 | |
| 9,299,770 B2 * | 3/2016 | Koyama | H01L 29/66045 | |
| 9,640,632 B2 * | 5/2017 | Ritenour | H01L 23/34 | |
| 9,691,889 B2 * | 6/2017 | Briere | H01L 27/0605 | |
| 10,355,130 B2 * | 7/2019 | Imai | H03F 3/213 | |
| 2007/0023897 A1 * | 2/2007 | Nakajima | H01L 23/3107 | 257/728 |
| 2008/0157222 A1 * | 7/2008 | Wang | H01L 27/0207 | 257/401 |
| 2008/0169487 A1 * | 7/2008 | Shimbo | H01L 27/0207 | 257/207 |
| 2011/0084341 A1 | 4/2011 | Kosaka | | |
| 2012/0012858 A1 * | 1/2012 | Inoue | H01L 21/765 | 257/76 |
| 2012/0199847 A1 * | 8/2012 | Takagi | H01L 29/0696 | 257/77 |
| 2014/0027778 A1 * | 1/2014 | Briere | H01L 29/2003 | 257/76 |
| 2015/0260783 A1 * | 9/2015 | Huang | G11C 16/0425 | 324/762.01 |
| 2015/0311332 A1 | 10/2015 | Zhang et al. | | |
| 2017/0250200 A1 * | 8/2017 | Lee | H01L 27/1255 | |

* cited by examiner

PRIOR ART

US 10,629,526 B1

TRANSISTOR WITH NON-CIRCULAR VIA CONNECTIONS IN TWO ORIENTATIONS

TECHNICAL FIELD OF THE INVENTION

The present invention relates generally to transistors. More specifically, the present invention relates to a transistor layout utilizing non-circular via connections in two orientations.

BACKGROUND OF THE INVENTION

Transistor devices are utilized in a wide variety of electronic circuit applications. Field-Effect Transistor (FET) devices typically include a drain lead, a source lead, and a gate lead. A channel is disposed between the drain and source, and the channel is the portion of the FET device that conducts current when the FET device is turned on. The gate is the control input of the device which is utilized to control the current flow in the channel.

In various circuit applications, FET devices may be utilized as two-port active devices. In a two-port configuration, two of the three FET leads serve as the input and output ports, and the third FET lead is utilized as the common connection which is connected to the ground potential of the circuit. Depending upon the particular two-port configuration, any one of the three FET leads can be utilized as either the input port, output port, or common connection.

BRIEF DESCRIPTION OF THE DRAWINGS

The accompanying figures in which like reference numerals refer to identical or functionally similar elements throughout the separate views, the figures are not necessarily drawn to scale, and which together with the detailed description below are incorporated in and form part of the specification, serve to further illustrate various embodiments and to explain various principles and advantages all in accordance with the present invention.

DETAILED DESCRIPTION

In overview, embodiments disclosed herein entail a transistor layout with non-circular via connections and an amplifier module having such a transistor. More specifically, embodiments of the transistor include non-circular via connections in two orientations that are placed along both the input and output sides of the active device region. On the input side, the major axis (e.g., long axis) of the non-circular via connection is oriented perpendicular to the long axis of the gate to minimize common-mode inductance. On the output side, the major axis of the non-circular via connection is oriented parallel to the longitudinal dimension of the gate to mitigate electromigration constraints. Accordingly, such a transistor layout may be suitably utilized in a two port circuit configuration, and can further achieve benefits in both die size and performance.

The following description entails the implementation of non-circular via connections in a field effect transistor (FET) device in a non-limiting fashion. It should be understood, however, that the non-circular via connections may be implemented within a wide variety of unipolar and bipolar transistor technologies.

The instant disclosure is provided to further explain in an enabling fashion at least one embodiment in accordance with the present invention. The disclosure is further offered to enhance an understanding and appreciation for the inventive principles and advantages thereof, rather than to limit in any manner the invention. The invention is defined solely by the appended claims including any amendments made during the pendency of this application and all equivalents of those claims as issued.

It should be understood that the use of relational terms, if any, such as first and second, top and bottom, and the like are used solely to distinguish one from another entity or action without necessarily requiring or implying any actual such relationship or order between such entities or actions. Furthermore, some of the figures may be illustrated using various shading and/or hatching to distinguish the different elements produced within the various structural layers. These different elements within the structural layers may be produced utilizing current and upcoming microfabrication techniques of depositing, patterning, etching, and so forth. Accordingly, although different shading and/or hatching is utilized in the illustrations, the different elements within the structural layers may be formed out of the same material.

Figure 1:
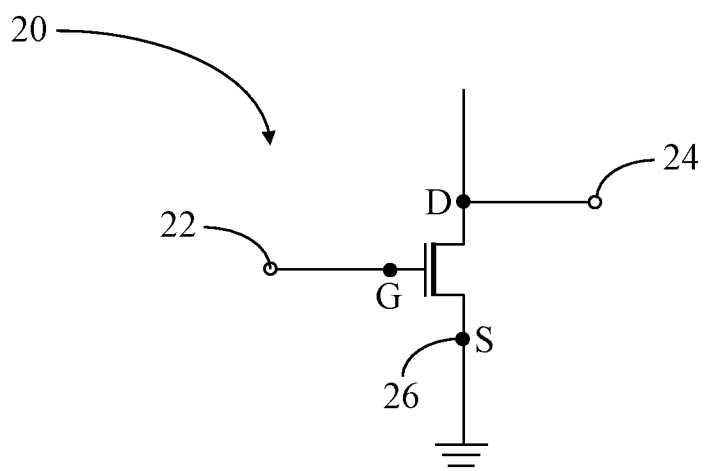
FIG. 1 shows a schematic of a common source FET device configuration.

Referring to FIG. 1, FIG. 1 shows a schematic of a common source field-effect transistor (FET) device configuration 20. In common source FET configuration 20, the gate, G, serves as an input port 22 and the drain, D, serves as an output port 24. The source, S, serves as a common connection 26 in common source configuration 20 since it is the FET lead which is grounded as shown in FIG. 1. Thus, common source configuration 20 is an example of a two-port active device in which two of the three leads of the FET serve as the input and output ports and the third lead is utilized as the common connection. For clarity of discussion, transistor layouts discussed herein have common source configuration 20. However, the following discussion applies equivalently to other two-port active device configurations in which, for example, the gate may serve as the common connection or the drain may serve as the common connection.

Some FET devices (e.g., microwave power FET devices) typically rely on through-wafer via connections to minimize common-node inductance because the common-node inductance limits the high-frequency performance of the FET device. The location of these via connections within a FET layout represents a tradeoff between performance and die size. FET performance benefits from placing via connections within the source contact immediately adjacent to the gate. However, die size can be significantly reduced when the via connections are not placed immediately adjacent to the gate.

In dealing with this tradeoff, power FET layouts have generally fallen into one of two design configurations, a "slot via" layout and an "end via" layout. In the "slot via"

layout, one or more via connections are placed in each source contact between active gate regions. In the "end via" layout, the via connections are placed outside the bounding box defined by the active gate regions, generally on the input side of the FET device due to practical electromigration constraints on the output side.

Figure 2:
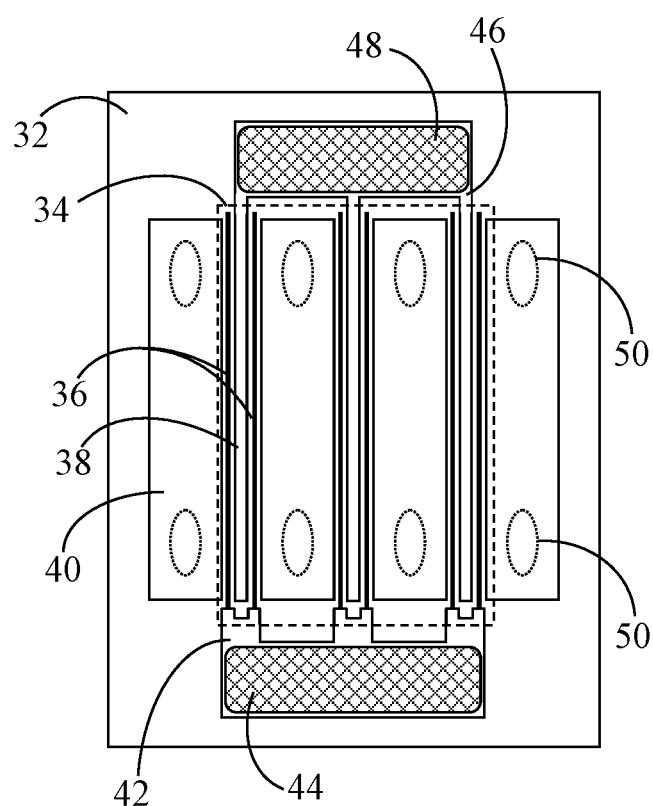
FIG. 2 shows a plan view of a layout of a prior art FET device.

FIG. 2 shows a plan view of a layout of a prior art FET device 30. FET device 30 may employ a multi-layer circuit approach configured to be disposed within a semiconductor substrate 32. FET device 30 includes an active region, generally denoted by a dashed line box 34, having sets of interdigitated gate fingers 36 (six shown), drain fingers 38 (three shown), and source fingers 40 (four shown) disposed in substrate 32 in a substantially parallel configuration. Gate fingers 36 are coupled together by a bus 42, and a bond pad, referred to herein as an input port 44, is coupled to bus 42 at an input side of active region 34. Similarly, drain fingers 38 are coupled together by another bus 46, and a bond pad, referred to herein as an output port 48, is coupled to bus 46 at an output side of active region 34. One or more via connections 50 are connected to each source finger 40. Via connections 50 extend through substrate 32 and serve to connect source fingers 40 to a ground plane (not shown) on a lower surface of substrate 32. Via connections 50 are typically non-circular (e.g., oblong, elliptical) and are placed in each source finger 40 adjacent to gate fingers 36. Further details of FET device 30 are not shown for clarity of illustration.

FET device 30 represents a six gate (e.g., six gate fingers 36) single transistor cell having a "slot via" layout (e.g., oblong via connections 50). In a typical transistor product, the single transistor cell of FET device 30 may be replicated side-by-side to build up a full-size transistor. In FET device 30, peak power is typically limited by the current-handling capability (width) of drain fingers 38.

Figure 3:
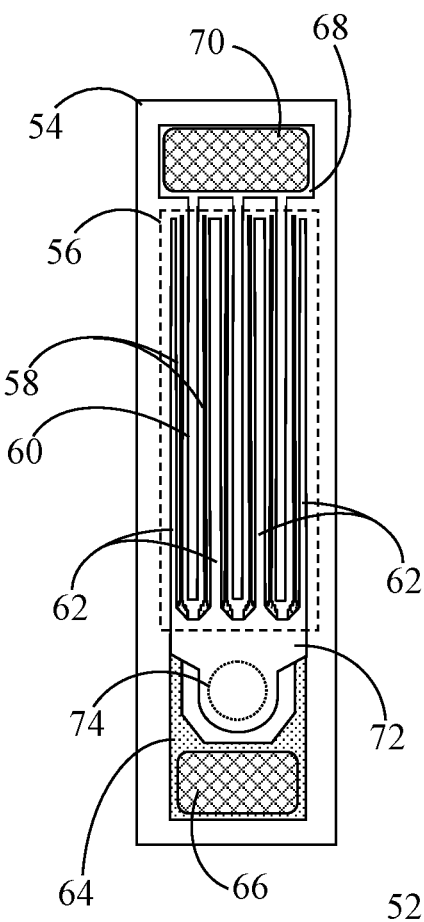
FIG. 3 shows a plan view of a layout of another prior art FET device.

FIG. 3 shows a plan view of a layout of another prior art FET device 52. FET device 52 may also employ a multi-layer circuit approach configured to be disposed within a semiconductor substrate 54. FET device 52 includes an active region, generally denoted by a dashed line box 56, having sets of interdigitated gate fingers 58 (six shown), drain fingers 60 (three shown), and source fingers 62 (four shown) disposed in substrate 54 in a substantially parallel configuration. Gate fingers 58 are coupled together by a bus 64 (shaded with a stippled pattern), and a bond pad, referred to herein as an input port 66, is coupled to bus 64 at an input side of active region 56. Similarly, drain fingers 60 are coupled together by another bus 68, and a bond pad, referred to herein as an output port 70, is coupled to bus 68 at an output side of active region 56. Source fingers 62 are coupled via a bus 72 to a single via connection 74. Via connection 74 extends through substrate 54 and serves to connect source fingers 62 to a ground plane (not shown) on a lower surface of substrate 54. In this example, via connection 74 is generally circular in cross-section. Further details of FET device 52 are not shown for clarity of illustration.

FET device 52 represents a six gate (e.g., six gate fingers 58) single transistor cell having an "end via" layout (e.g., a single circular via connection 74). Again, in a typical transistor product, the single transistor cell of FET device 52 may be replicated side-by-side to build up a full-size transistor. Like FET device 30, peak power is again limited by the current-handling capability (width) of drain fingers 60.

Referring concurrently to FIGS. 2 and 3, because there are no via connections in source fingers 62 of FET device 52, as compared to FET device 30, source fingers 62 can be made dramatically narrower than source fingers 40 of FET device 30. However, common-node inductance (also referred to as source inductance) is now significantly higher in FET device 52, as compared to FET device 30, because six gate fingers 58 share a single via connection 74, rather than sharing eight via connections 50 in the "slot via" layout of FET device 30. The significantly higher common-node inductance of the "end via" layout of FET device 52 degrades the power gain relative to the "slot via" layout of FET device 30.

Embodiments discussed herein entail a transistor layout that enables a reduction in common-node inductance without requiring excessive current density in the interconnect metal. As a result, embodiments discussed herein can further enable a reduction in die size as compared to FET device 30 but may additionally achieve better performance than FET device 52.

Figure 4:
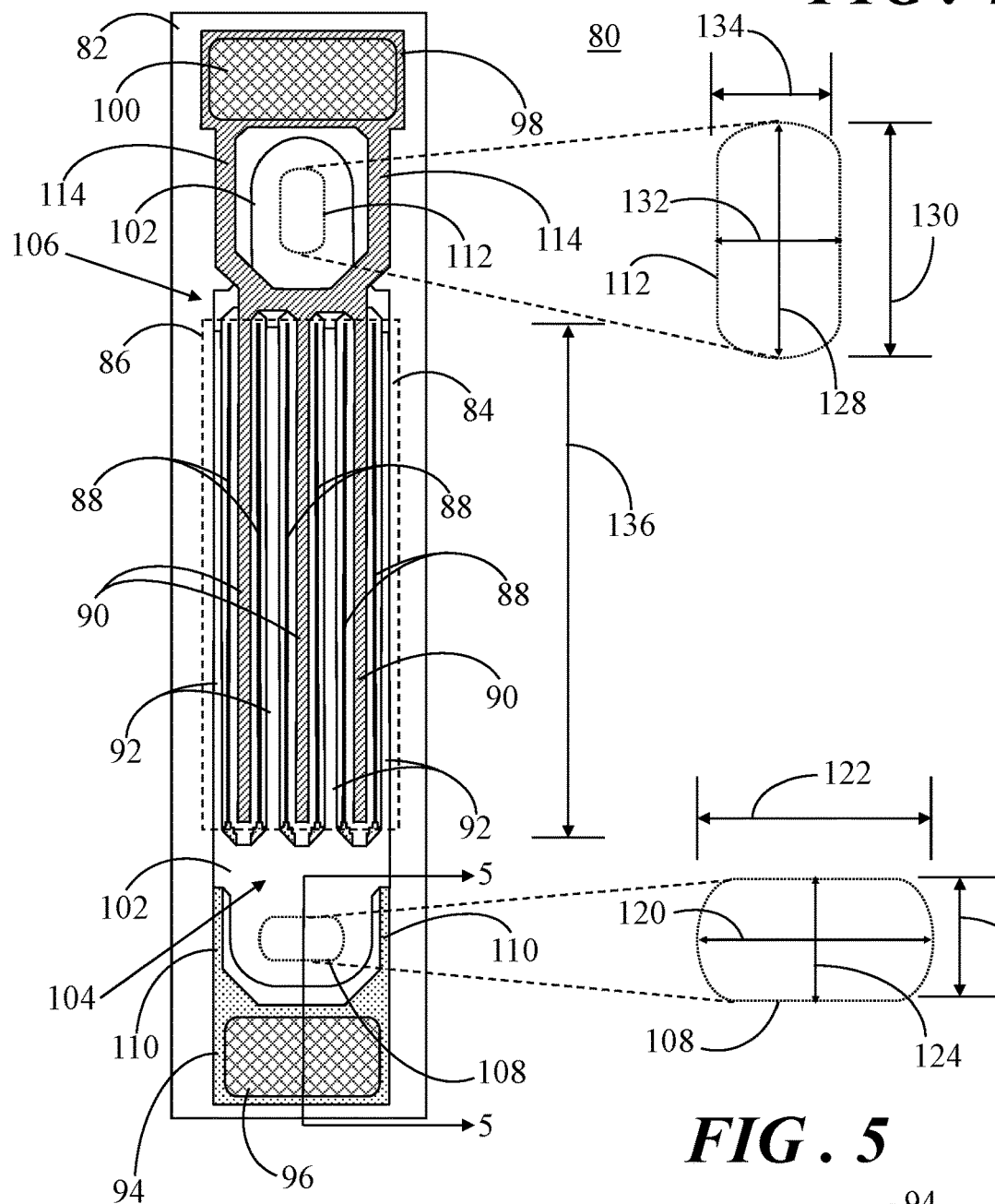
FIG. 4 shows a plan view of a layout of a FET device in accordance with an embodiment of the present invention.
Figure 5:
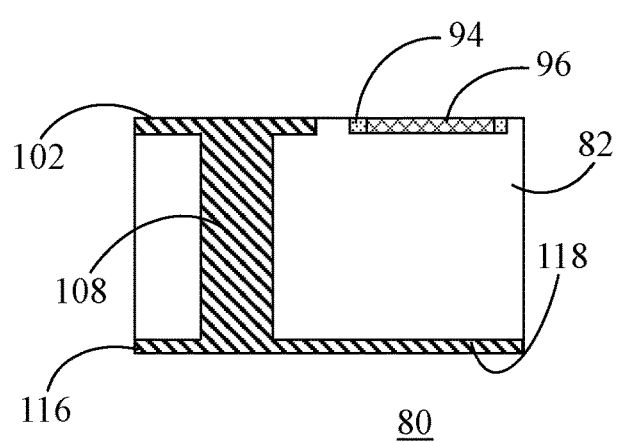
FIG. 5 shows a side sectional view of the FET device along section lines 5-5 of FIG. 4.

Referring now to FIGS. 4 and 5, FIG. 4 shows a plan view of a layout of a FET device 80 in accordance with an embodiment of the present invention and FIG. 5 shows a side sectional view of FET device 80 along section lines 5-5 of FIG. 4. FET device 30 may employ a multi-layer circuit approach configured to be disposed within a semiconductor substrate 82. FET device 80 includes an active region 84 formed in substrate 82. Active region 84 is bounded by an outer periphery 86, generally represented by a dashed line box. Active region 84 includes sets of interdigitated input gate fingers 88 (six shown), output drain fingers 90 (three shown), and common source fingers 92 (four shown) disposed within substrate 82 and oriented substantially parallel to one another.

Gate fingers 88 are coupled together by a bus 94, and a bond pad, referred to herein as an input port 96, is coupled to bus 94 at an input side of active region 84. Similarly, drain fingers 90 are coupled together by another bus 98, and a bond pad, referred to herein as an output port 100, is coupled to bus 98 at an output side of active region 84. Opposing ends of source fingers 92 are coupled to one another via a bus structure 102. In order to readily distinguish the various structures in the various metal layers, bus 94 interconnecting gate fingers 88 to input port 96 are shaded with a stippled pattern. Further, drain fingers 90 and bus 98 interconnecting drain fingers 90 to output port 100 are shaded with upward and rightward directed hatching. Still further, bus structure 102 coupling opposing ends of source fingers 92 to one another has no shading.

As shown, input port 96 is positioned outside of outer periphery 86 of active region 84 at a first longitudinal end 104 of the sets of gate, drain and source fingers 88, 90, 92. Additionally, output port 100 is positioned outside of outer periphery 86 of active region 84 at a second longitudinal end 106 of the sets of gate, drain and source fingers 88, 90, 92.

FET device 80 further includes a first via connection 108 disposed at outer periphery 86 of active region 84 proximate input port 96. In some embodiments, bus 94 includes a first pair of electrically conductive interconnects 110 coupled to input port 96 and to the input fingers (e.g., gate fingers 88) of FET device 80. As such, first via connection 108 is surrounded by input port 96, first pair of electrically conductive interconnects 110, and outer periphery 86 of active region 84. A second via connection 112 is also disposed at outer periphery 86 of active region 84 proximate output port 100. More particularly, bus 98 includes a second pair of electrically conductive interconnects 114 coupled to output port 100 and to the output fingers (e.g., drain fingers 90) of FET device 80. As such, second via connection 112 is surrounded by output port 100, second pair of electrically conductive interconnects 114, and outer periphery of active region 84.

First and second via connections 108, 112 are in electrical contact with bus structure 102, and as described previously, bus structure 102 is coupled to opposing ends of source fingers 92. First and second via connections 108, 112 extend through substrate 82 and thus serve to connect source fingers 92 to a common node (e.g., a ground plane 116 visible in FIG. 5) on a lower surface 118 of substrate 82.

As can best be seen in the enlarged view of first via connection 108 in FIG. 4, first via connection 108 may have a noncircular cross-section with a first major axis 120 (e.g., the long axis) having a first length 122 (alternatively referred to as a first major axis length) and a first minor axis 124 (e.g., the short axis) having a second length 126 (alternatively referred to as a first minor axis length) that is less than first length 122. Likewise, second via connection 112 has a noncircular cross-section with second major axis 128 (e.g., the long axis) having a third length 130 (alternatively referred to as a second major axis length) and a second minor axis 132 (e.g., the short axis) having a fourth length 134 (alternatively referred to as a second minor axis length) that is less than third length 130.

Second major axis 128 of second via connection 112 is oriented non-parallel to first major axis 120 of first via connection 108. For example, second major axis 128 of second via connection 112 may be oriented perpendicular to first major axis 120 of first via connection 108. Additionally, first major axis 120 of first via connection 108 is oriented perpendicular to a longitudinal dimension 136 of the sets of gate, drain, and source fingers 88, 90, 92 and second major axis 128 of second via connection 112 is oriented parallel to longitudinal dimension 136 of the sets of gate, drain, and source fingers 88, 90, 92.

In some manufacturing environments, process constraints may require that all through-wafer vias have the same size and shape. Thus, in some embodiments, first length 122 of first via connection 108 may be equal to third length 130 of second via connection 112. Likewise, second length 126 of first via connection 108 may be equal to fourth length 134 of second via connection 112. Accordingly, first and second via connections 108, 112 may be the same size and shape. However, second via connection 112 is rotated ninety degrees relative to first via connection 108. As such, in accordance with some embodiments, both of first and second via connections 108, 112 are the same size and shape, as shown. However, in alternative embodiments, first via connection 108 proximate input port 96 may be a different shape (e.g., a circular shape, which may have lower inductance than an oblong shape) when not subject to process constraints requiring all through-wafer vias to have the same size and shape. Still further, although first and second via connections 108, 112 are shown as elliptical or oval shaped, alternative embodiments may have other shapes, such as an oblong rectangular shape.

The layout of FET device 80 thus represents an "end via" layout in which via connections 108, 112 are placed outside the bounding box (outer periphery 86) defined by the active gate region 84. Accordingly, die size can be significantly reduced (as compared to FET device 30 of FIG. 2) by narrowing source fingers 92 because there are no via connections in source fingers 92 of FET device 80. Further, the layout of FET device 80 that includes two via connections 108, 112 effectively reduces the common-node inductance (as compared to the single via connection configuration of FET device 52 of FIG. 3). Still further, the particular orientation of the oblong second via connection 112 largely prevents the introduction of an electromigration limitation on the output.

Figure 6:
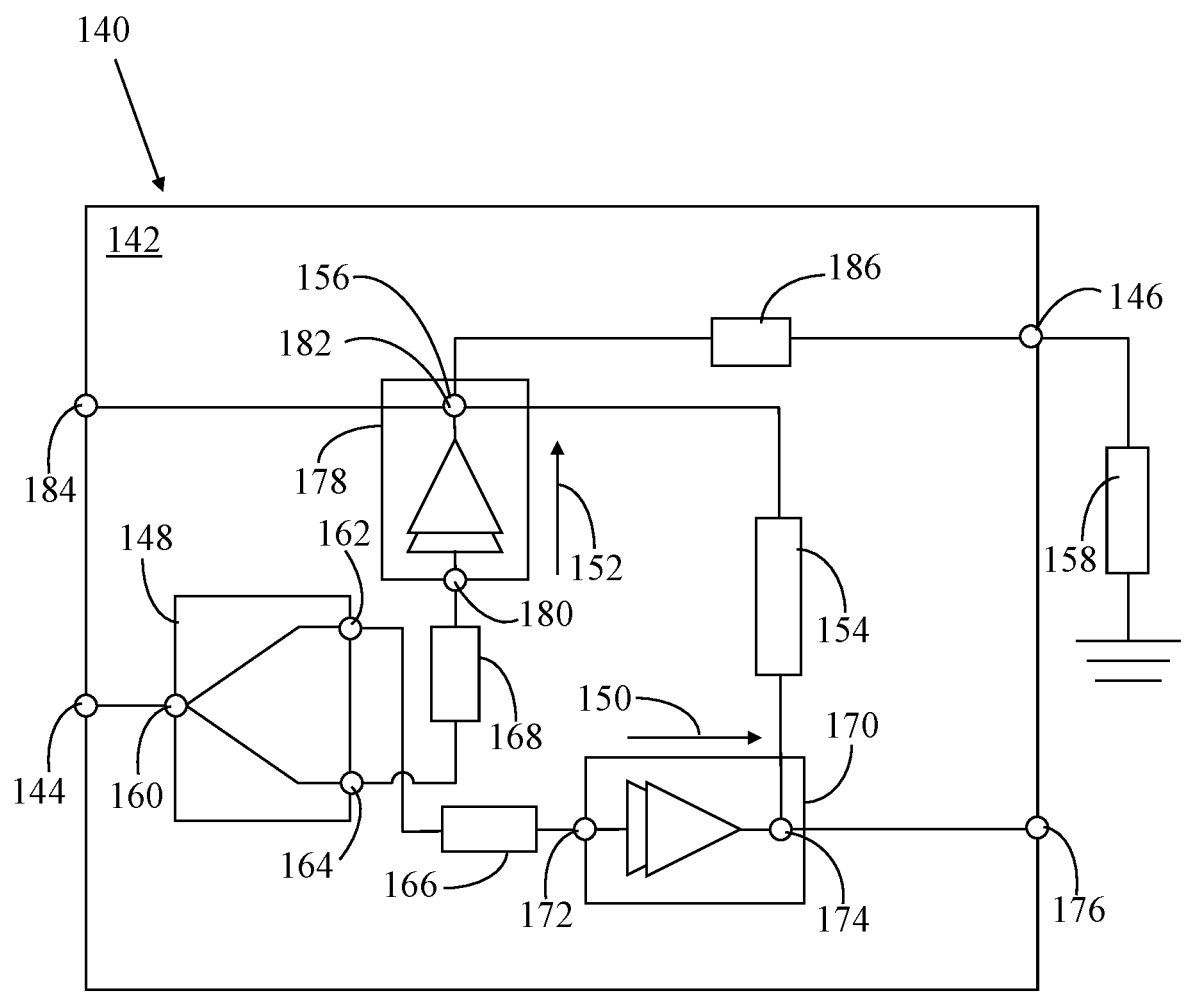
FIG. 6 shows a schematic diagram of an amplifier, in accordance with an example embodiment of the present invention.

Referring now to FIG. 6, FIG. 6 shows a schematic diagram of a Doherty amplifier 140 in which FET device 80 may be incorporated in accordance with an example embodiment of the present invention. As indicated in FIG. 6 with box 142, some or all components of Doherty amplifier 140 may be implemented in a single device package or module.

Doherty amplifier 140 includes an RF input node 144, an RF output node 146, a power splitter 148, a carrier amplifier path 150, a peaking amplifier path 152, a phase delay and impedance inversion element 154, and a combining node 156, in an example embodiment. When incorporated into a larger RF system, RF input node 144 is coupled to an RF signal source (not illustrated), and RF output node 146 is coupled to a load 158 (e.g., an antenna or other load). The RF signal source provides an input RF signal, which is an analog signal that includes spectral energy that typically is centered around one or more carrier frequencies. Fundamentally, Doherty amplifier 140 is configured to amplify the input RF signal, and to produce an amplified RF signal at the RF output node 146.

Power splitter 148 has an input 160 and two outputs 162, 164, in an example embodiment. Power splitter input 148 is coupled to the RF input node 144 to receive the input RF signal. Power splitter 148 is configured to divide the RF input signal received at input 160 into first and second RF signals (or carrier and peaking signals), which are provided to the carrier and peaking amplifier paths 150, 152 through outputs 162, 164. Power splitter 148 may include a first phase shift element, which is configured to impart a first phase shift (e.g., about a 90 degree phase shift) to the peaking signal before it is provided to output 164. Accordingly, at outputs 162, 164, the carrier and peaking signals may be about 90 degrees out of phase from each other.

When Doherty amplifier 140 has a symmetrical configuration (i.e., a configuration in which the carrier and peaking amplifier power transistors are substantially identical in size), power splitter 148 may divide or split the input RF signal received at the input 160 into two signals that are very similar with, for example, equal power. Conversely, when Doherty amplifier 140 has an asymmetrical configuration (i.e., a configuration in which one of the amplifier power transistors, typically the peaking amplifier transistor, is significantly larger), power splitter 148 may output signals having unequal power. Power splitter 148 may be implemented with fixed-value, passive components. Alternatively, power splitter 148 may be implemented with one or more controllable variable attenuators and/or variable phase shifters, which enable the power splitter 148 to attenuate and/or phase shift the carrier and peaking signals based on externally-provided control signals.

Outputs 162, 164 of power splitter 148 are connected to the carrier and peaking amplifier paths 150, 152, respectively. As shown in FIG. 6, the connection between output 164 and peaking amplifier path 152 crosses over the connection between output 162 and carrier amplifier path 150. This cross-over configuration may enable compaction and miniaturization of amplifier 140 by enabling a compact arrangement of input circuits 166, 168. In other embodiments, outputs 162, 164 may be reversed, enabling outputs 162, 164 to be connected to carrier and peaking paths 150, 152 without one connection crossing over the other connection.

Carrier amplifier path 150 is configured to amplify the carrier signal from power splitter 148, and to provide the amplified carrier signal to power combining node 156. Similarly, peaking amplifier path 152 is configured to amplify the peaking signal from power splitter 148, and to provide the amplified peaking signal to power combining node 156, where the paths 150, 152 are designed so that the amplified carrier and peaking signals arrive in phase with each other at power combining node 156.

In the illustrated example, carrier amplifier path 150 includes input circuit 166, (e.g., including an impedance matching circuit), a carrier amplifier die 170, and phase delay and impedance inversion element 154. Carrier amplifier die 170 includes an RF input terminal 172, an RF output terminal 174, and one or more amplification stages coupled between the input and output terminals 172, 174, in various embodiments. The RF input terminal 172 is coupled through input circuit 166 to output 162 of power splitter 148, and thus the RF input terminal 172 receives the carrier signal produced by power splitter 148.

Each amplification stage of the carrier amplifier die 170 includes a power transistor. More specifically, each power transistor includes a control terminal (e.g., a gate terminal) and first and second current-carrying terminals (e.g., a drain terminal and a source terminal). In a single-stage device, which would include a single power transistor, the control terminal is electrically connected to RF input terminal 172, one of the current-carrying terminals (e.g., the drain terminal or the source terminal) is electrically connected to RF output terminal 174, and the other current-carrying terminal (e.g., the source terminal or the drain terminal) is electrically connected to a ground reference (or another voltage reference).

Conversely, a two-stage device would include two power transistors coupled in series, where a first transistor functions as a driver amplifier transistor and a second transistor functions as an output amplifier transistor. In such an embodiment, the control terminal of the driver amplifier transistor is electrically connected to the RF input terminal 172, one of the current-carrying terminals of the driver amplifier transistor (e.g., the drain terminal or the source terminal) is electrically connected to the control terminal of the output amplifier transistor, and the other current-carrying terminal of the driver amplifier transistor (e.g., the source terminal or the drain terminal) is electrically connected to the ground reference (or another voltage reference). Additionally, one of the current-carrying terminals of the output amplifier transistor (e.g., the drain terminal or the source terminal) is electrically connected to the RF output terminal 174, and the other current-carrying terminal of the output amplifier transistor (e.g., the source terminal or the drain terminal) is electrically connected to the ground reference (or another voltage reference). In accordance with some embodiments, FET device 80 (FIG. 4) or any other transistor configuration having the via connection layout as described above may be implemented as the power transistor(s) of carrier amplifier die 170.

RF output terminal 174 of carrier amplifier die 170 is coupled to power combining node 156 through phase shift and impedance inversion element 154, in an example embodiment. According to some configurations, the impedance inversion element is a lambda/4 ($\lambda/4$) transmission line phase shift element (e.g., a microstrip line), which imparts about a 90 degree relative phase shift to the carrier signal after amplification by carrier amplifier die 170. In addition, a drain bias voltage terminal 176 may be coupled to an external bias circuit (not shown) for providing a DC bias voltage to RF output terminal 174 of carrier amplifier die 170. A first end of the impedance inversion element 154 is also coupled to RF output terminal 174 of carrier amplifier die 170, and a second end of impedance inversion element 154 is coupled to power combining node 156.

Reference is now made to peaking amplifier path 152, which includes a peaking amplifier die 178 and input circuit 168 (e.g., including an impedance matching circuit), in an example embodiment. Peaking amplifier die 178 includes an RF input terminal 180, an RF output terminal 182, and one or more amplification stages coupled between the input and output terminals 180, 182. RF input terminal 180 is coupled to output 164 of power splitter 148, and thus RF input terminal 180 receives the peaking signal produced by power splitter 148.

As with the carrier amplifier die 170, each amplification stage of peaking amplifier die 178 includes a power transistor with a control terminal and first and second current-carrying terminals. Again, the power transistor may be FET device 80 (FIG. 4) or any other transistor configuration having the via connection layout as described above. The power transistor(s) of the peaking amplifier die 178 may be electrically coupled between the RF input and output terminals 180, 182 in a manner similar to that described above in conjunction with the description of carrier amplifier die 170. Additional other details discussed in conjunction with the description of carrier amplifier die 170 also apply to peaking amplifier die 178, and those additional details are not reiterated here for brevity.

RF output terminal 182 of the peaking amplifier die 178 is coupled to power combining node 156. According to an example, RF output terminal 182 of peaking amplifier die 178 and combining node 156 are implemented with a common element. For example, RF output terminal 182 of peaking amplifier die 178 may be configured to function both as combining node 156 and as RF output terminal 182 of peaking amplifier die 178. In addition, a drain bias voltage terminal 184 may be coupled to an external bias circuit (not shown) for providing a DC bias voltage to RF output terminal 182 of peaking amplifier die 178. Still further, RF output terminal 182 may be configured to enable a connection between the second end of phase shift and impedance inversion element 154 and peaking amplifier die 178 (e.g., implemented with a wirebond array) to extend in a direction that is angularly offset from (e.g., perpendicular to) the direction of the input signal to peaking amplifier die 178 (e.g., as indicated with arrow 152). This may be accomplished, for example, by providing an elongated RF input terminal 180 (e.g., gate terminal) that is angularly offset from (e.g., perpendicular to) an elongated portion of RF output terminal 182 (e.g., drain terminal) to which phase shift element 154 is coupled.

The amplified carrier and peaking RF signals combine in phase at combining node 156 and combining node 156 is electrically coupled to RF output node 146 to provide the amplified and combined RF output signal to the RF output node 146. In an example embodiment, an output impedance matching network 186 between combining node 156 and the RF output node 146 functions to present proper load impedances to each of the carrier and peaking amplifier die 170, 178. The resulting amplified RF output signal is produced at RF output node 146, to which output load 158 (e.g., an antenna) is connected.

Amplifier 140 is configured so that carrier amplifier path 150 provides amplification for relatively low level input signals, and both amplification paths 150, 152 operate in combination to provide amplification for relatively high level input signals. This may be accomplished, for example, by biasing carrier amplifier die 170 so that the carrier amplifier die 170 operates in a class AB mode, and biasing peaking amplifier die 178 so that peaking amplifier die 178 operates in a class C mode.

In the example illustrated in FIG. 6 and described above, a first phase shift element in splitter 148 imparts about 90 degrees of phase shift to the peaking signal prior to amplification, and phase shift and impedance inversion element 154 similarly imparts about 90 degrees of phase shift to the amplified carrier signal so that the amplified carrier and peaking signals may combine in phase at combining node 156. Such an architecture is referred to as a non-inverted Doherty amplifier architecture. In another example, a first phase shift element in splitter 148 may impart about 90 degrees of phase shift to the carrier signal prior to amplification, rather than to the peaking signal, and phase shift and impedance inversion element 154 may be included instead at the output of the peaking amplifier. Such an alternate architecture is referred to as an inverted Doherty amplifier architecture. In still other examples, other combinations of phase shift elements may be implemented in the carrier and/or peaking paths 150, 152 prior to amplification to achieve about 90 degrees of phase difference between the carrier and peaking signals prior to amplification, and the phase shifts applied to the amplified carrier and peaking signals may be selected accordingly to ensure that the signals combine in phase at combining node 156. For example, phase shifts greater than 90 degrees may be applied along carrier and peaking paths 150, 152.

Figure 7:
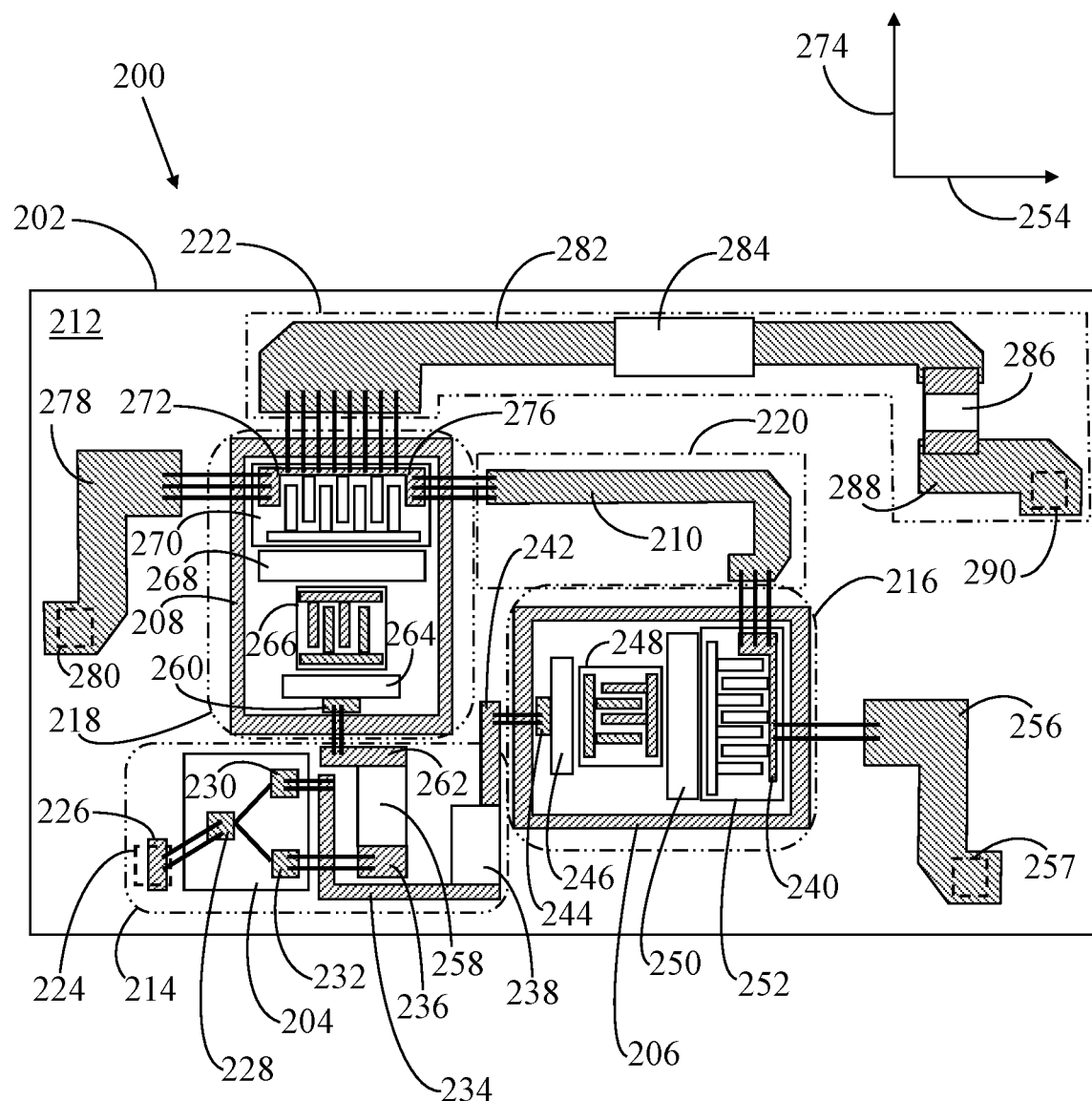
FIG. 7 shows a top view of an amplifier module, in accordance with an example embodiment of the present invention.

An example of a physical implementation of the Doherty amplifier circuit of FIG. 6 now will be described in detail in conjunction with FIG. 7. More specifically, FIG. 7 shows a top view of a Doherty amplifier module 200, in accordance with an example configuration of the present invention.

Doherty amplifier module 200 includes a substrate 202, a power splitter 204 (e.g., power splitter 148, FIG. 6), a carrier amplifier die 206 (e.g., carrier amplifier die 170, FIG. 6), a peaking amplifier die 208 (e.g., peaking amplifier die 178, FIG. 6), a phase shift and impedance inversion element 210 (e.g., phase shift and impedance inversion element 154, FIG. 6), and various other circuit elements, which will be discussed in more detail below. Doherty amplifier module 200 may be implemented as a land grid array (LGA) module, for example. Accordingly, substrate 202 has a component mounting surface 212 and a land surface (not shown) opposite component mounting surface 212. Component mounting surface 212 and the components mounted to that surface 212 optionally may be covered with an encapsulant material (not shown). Alternatively, the components could be contained within an air cavity, which is defined by various structures (not illustrated) overlying mounting surface 212.

A plurality of non-overlapping zones are defined at the mounting surface 212 of substrate 202. More specifically, the non-overlapping zones may include an input signal and splitter zone 214, a first-die mounting zone 216, a second-die mounting zone 218, an inter-amplifier impedance inverter zone 220, and an output match zone 222. Within input signal and splitter zone 214, a conductive landing pad 224 (represented by a dashed line box) exposed at the land surface is electrically coupled through substrate 202 to a conductive contact 226 at the mounting surface 212. Landing pad 224 and contact 226, along with the electrical connections between them, function as the RF input node (e.g., RF input node 144, FIG. 6) for module 200.

Power splitter 204 is coupled to mounting surface 212 in input signal and splitter zone 214. Power splitter 204 may include one or more discrete die and/or components, although it is represented in FIG. 7 as a single element. Power splitter 204 includes an input terminal 228 (e.g., input 160, FIG. 6) and two output terminals 230, 232 (e.g., outputs 162, 164, FIG. 6). Input terminal 228 is electrically coupled (e.g., through wirebonds, as shown) to conductive contact 226 to receive an input RF signal. In addition, output terminals 230, 232 are electrically coupled (e.g., through additional wirebonds, as shown) to conductive contacts 234, 236 at the mounting surface 212. Power splitter 204 is configured to split the power of the input RF signal received through input terminal 228 into first and second RF signals (e.g., carrier and peaking signals), which are produced at the output terminals 230, 232. In addition, power splitter 204 may include a first phase shift element configured to impart about a 90 degree phase shift to the RF signal provided at output terminal 232. Power splitter 204 may consist of fixed-value, passive components or power splitter 204 may include variable phase shifters and/or attenuators.

The first and second RF signals may have equal or unequal power, as discussed previously. The first RF signal produced at output terminal 230 and conveyed to conductive contact 234 is amplified through a carrier amplifier path. The carrier amplifier path includes an input circuit 238 (e.g., input circuit 166, FIG. 6) mounted within the input signal and splitter zone 220, carrier amplifier die 206 (e.g., die 170, FIG. 6) mounted within first-die mounting zone 216, phase shift and impedance inversion element 210 (e.g., impedance inversion element 154, FIG. 6) connected to substrate 202 within the inter-amplifier impedance inverter zone 220 and connected to an RF output terminal 240 of carrier amplifier die 206.

Input circuit 238 is electrically connected between conductive contacts 234 and 242. Although the detail is not shown in FIG. 7, input circuit 238 may include a plurality of discrete and/or integrated components (e.g., inductors and capacitors) configured to provide proper impedance matching between the first power splitter output 230 and the input to carrier amplifier die 206.

Conductive contact 242 is electrically coupled (e.g., with wirebonds) to an RF input terminal 244 of the carrier amplifier die 206, in order to provide an RF carrier signal for amplification to the carrier amplifier die 206. The illustrated embodiment of carrier amplifier die 206 embodies a two-stage amplifier. More specifically, the electrical components of carrier amplifier die 206 include RF input terminal 244, an input matching network 246, a driver transistor 248, an interstage matching network 250, an output transistor 252, and RF output terminal 240. Driver and output transistors 248, 252 are coupled in series between RF input and output terminals 244, 240. Driver transistor 248 is configured to apply a relatively low gain to the carrier signal, and output transistor 252 is configured to apply a relatively high gain to the carrier signal after preliminary amplification by driver transistor 248. In other embodiments, the carrier amplifier die 206 may embody a single stage amplifier, or may include more than two amplification stages.

Each of the transistors 248, 252 may be a field effect transistor (FET) (such as a metal oxide semiconductor FET (MOSFET), a laterally diffused MOSFET (LDMOS FET), a high electron mobility transistor (HEMT), and so on). Alternatively, each of the transistors 248, 252 may be a bipolar junction transistor (BJT). More particularly, and in accordance with an embodiment, FET device 80 (FIG. 4) or any other suitable transistor configuration having the via connection layout as described above may be implemented for driver and output transistors 248, 252.

RF input terminal 244 of carrier amplifier die 206 is electrically coupled to the gate terminal of driver transistor 248 through input matching network 246, and the drain terminal of transistor 248 is electrically coupled to the gate terminal of output transistor 252 through interstage matching network 250. The drain terminal of output transistor 252 may be electrically coupled to RF output terminal 240. Accordingly, the signal path through carrier amplifier die 206 is in a direction extending from the RF input terminal 244 toward RF output terminal 240, which direction is indicated by an arrow 254.

An amplified RF carrier signal is produced by the carrier amplifier die 206 at RF output terminal 240. In the illustrated example, the RF output terminal 240 is electrically coupled to a first end of phase shift and impedance inversion element 210, which is at least partially exposed at the mounting surface 212, with a plurality of parallel, closely spaced wirebonds. In addition, a drain bias voltage terminal 256 may be coupled to an external bias circuit (not shown) that is electrically connected through substrate 202 to a landing pad 257 (represented by a dashed line box) for providing a DC bias voltage to RF output terminal 240 of carrier amplifier die 206 (e.g., the drain terminal), as discussed in connection with FIG. 6. RF output terminal 240 of carrier amplifier die 206 includes an elongated first pad that is configured to enable wirebonds to be connected to the first pad so that the wirebonds extend in a direction that is angularly offset from (e.g., perpendicular to) the direction of the signal path 254 through the carrier amplifier die 206.

Through the wirebond array, the RF output terminal 240 is electrically coupled to phase shift and impedance inversion element 210, which is located in the inter-amplifier impedance inverter zone 220. Phase shift and impedance inversion element 210 may be implemented with a transmission line (e.g., a microstrip line) having an electrical length of about lambda/4 ($\lambda/4$) or less. The transmission line has a first end that is proximate to the carrier amplifier die 206 and a second end that is proximate to peaking amplifier die 208. Phase shift and impedance inversion element 210 may be formed from a portion of one or more of the metal layers of the module substrate 202 and/or may be formed on a surface of the module substrate 202.

Moving back to power splitter 204 in the input signal and splitter zone 214, the second RF signal (i.e., the peaking signal) produced at output terminal 232 of power splitter 204 and conveyed to conductive contact 236 is amplified through a peaking amplifier path. The peaking amplifier path includes an input circuit 258 within the input signal and splitter zone 214 and peaking amplifier die 208 (e.g., die 178, FIG. 6) mounted within second-die mounting zone 218. As mentioned above, power splitter 204 may impart about a 90 degree phase shift to the RF signal provided at output terminal 232. Accordingly, the phase of the peaking signal received at an RF input terminal 260 of peaking amplifier die 208 may be delayed by about 90 degrees with respect to the carrier signal received at RF input terminal 244 of carrier amplifier die 206.

Input circuit 258 is electrically connected between conductive contacts 234 and 262. Although the detail is not shown in FIG. 7, input circuit 258 may include a plurality of discrete and/or integrated components (e.g., inductors and capacitors) configured to provide proper impedance matching between the second power splitter output 232 and the input to the peaking amplifier die 208. Conductive contact 262 is electrically coupled (e.g., with wirebonds) to RF input terminal 260 of peaking amplifier die 208, in order to provide an RF carrier signal for amplification to peaking amplifier die 208. The illustrated example of peaking amplifier die 208 also embodies a two-stage amplifier. More specifically, the electrical components of peaking amplifier die 208 include RF input terminal 260, an input matching network 264, a driver transistor 266, an interstage matching network 268, an output transistor 270, and an RF output terminal 272. The driver and output transistors 266, 270 are coupled in series between the RF input and output terminals 260, 272. In other configurations, peaking amplifier die 208 may embody a single stage amplifier, or may include more than two amplification stages. Again, FET device 80 (FIG. 4) or any other suitable transistor configuration having the via connection layout as described above may be implemented for driver and output transistors 266, 270.

RF input terminal 260 of peaking amplifier die 208 is electrically coupled to the gate terminal of driver transistor 266 through input matching network 264, and the drain terminal of driver transistor 266 is electrically coupled to the gate terminal of output transistor 270 through inter-stage matching network 268. The drain terminal of output transistor 270 may be electrically coupled to RF output terminal 272. Accordingly, the signal path through the peaking amplifier die 208 is in a direction extending from RF input terminal 260 toward RF output terminal 272, which direction is indicated by an arrow 274.

An amplified RF peaking signal is produced by the peaking amplifier die 208 at RF output terminal 272. As mentioned above, RF output terminal 272 may be electrically coupled to impedance inversion element 210 with a wirebond array, and RF output terminal 272 functions as a combining node 276 (e.g., combining node 156, FIG. 6) at which the amplified and delayed carrier amplifier signal is combined, in phase, with an amplified peaking amplifier signal. In addition, a drain bias voltage terminal 278 may be coupled to an external bias circuit (not shown) that is electrically connected through substrate 202 to a landing pad 280 (represented by a dashed line box) for providing a DC bias voltage to RF output terminal 272 of peaking amplifier die 208 (e.g., the drain terminal), as discussed in connection with FIG. 6.

Except for the configurations of the RF output terminals 240, 272, peaking amplifier die 208 may be structurally identical to carrier amplifier die 206, meaning that the two dies 206, 208 include the same structural and electrical elements arranged and interconnected in the same manner. Further, peaking amplifier die 208 and carrier amplifier die 206 may also be identical in size, rendering the Doherty amplifier module 200 a symmetric Doherty amplifier. In another example, peaking amplifier die 208 and carrier amplifier die 206 may have different sizes, the rendering the Doherty amplifier module 200 an asymmetric Doherty amplifier.

Through a wirebond array, the RF output terminal 272 is electrically coupled to phase shift and impedance inversion element 210. Accordingly, the amplified carrier signal produced by the carrier amplifier die 206 is received at the RF output terminal 272 of peaking amplifier die 208 through a wirebond array, phase shift and impedance inversion element 210, and another wirebond array. The amplified peaking signal produced by the peaking amplifier die 208 also is received at RF output terminal 272, and the module 200 is configured so that the amplified carrier and peaking signals arrive and are combined at RF output terminal 272 (or combining node 276) in phase with each other.

RF output terminal 272 (or combining node 276) is electrically coupled to a conductive output trace 282 at mounting surface 212 with a wirebond array. An output impedance matching network 284 and/or a decoupling capacitor 286 may be coupled along output trace 282. Output impedance matching network 284 functions to present the proper load impedance to combining node 276. Although the detail is not shown in FIG. 7, the output impedance matching network 284 may include various discrete and/or integrated components (e.g., capacitors, inductors, and/or resistors) to provide the desired impedance matching. Output impedance matching network 284 is electrically coupled to a conductive contact 288 at mounting surface 212. Conductive contact 288 is in electrical contact with a landing pad 290 exposed at the land surface of substrate 202. Landing pad 290 and contact 288, along with the electrical connections between them, function as the RF output node (e.g., RF output node 146, FIG. 6) for module 200.

The above described embodiment includes two-way Doherty power amplifier implementation, which includes a carrier amplifier and a peaking amplifier. According to other embodiments, a Doherty power amplifier may include more than one peaking amplifier, or module 200 may be modified to implement types of amplifiers other than Doherty amplifiers. That is, various modifications may be made to module 200 while still including transistors that have the via connection layout as described in detail above.

Further, although embodiments have been described herein with respect to a Doherty power amplifier, those of skill in the art would understand, based on the description herein, that embodiments of the inventive subject matter may be used in conjunction with virtually any type of multiple path amplifier. Accordingly, the transistor having the via connection layout described herein is not limited to use with Doherty amplifiers, nor is the transistor having via connection layout limited to use with amplifiers having only two amplification paths. Rather, the transistor having the via connection layout may be implemented within a wide variety of circuits.

Embodiments described herein entail a transistor having a transistor layout with non-circular via connections and an amplifier module having such a transistor. An embodiment of transistor comprises an active region formed in a substrate, the active region being bounded by an outer periphery, the active region including a set of input fingers, a set of output fingers, and a set of common fingers disposed within the substrate and oriented substantially parallel to one another. The transistor further comprises an input port, an output port, a first via connection disposed at the outer periphery of the active region proximate the input port, and a second via connection disposed at the outer periphery of the active region proximate the output port, the second via connection having a noncircular cross-section with a second major axis and a second minor axis, the second major axis having a second major axis length, the second minor axis having a second minor axis length that is less than the second major axis length, wherein the second major axis is oriented parallel to a longitudinal dimension of the sets of input, output, and common fingers.

Another embodiment of a transistor comprises an active region formed in a substrate, the active region being bounded by an outer periphery, the active region including a set of input fingers, a set of output fingers, and a set of common fingers disposed within the substrate and oriented substantially parallel to one another. The transistor further comprises an input port, an output port, a first via connection and a second via connection. The first via connection is disposed at the outer periphery of the active region proximate the input port, the first via connection having a noncircular cross-section with a first major axis and a first minor axis, the first major axis being oriented perpendicular to a longitudinal dimension of the sets of input, output, and common fingers, the first major axis having a first length, and the first minor axis having a second length that is less than the first length. The second via connection is disposed at the outer periphery of the active region proximate the output port, the second via connection having the noncircular cross-section with a second major axis and a second minor axis, the second major axis being oriented parallel to the longitudinal dimension of the sets of input, output, and common fingers, the second major axis having a third length, the second minor axis having a fourth length that is less than the third length, and the second major axis of the second via connection being oriented non-parallel to the first major axis of the first via connection, wherein the first and second via connections extend through the substrate and connect to a common node of the transistor.

An embodiment of an amplifier module comprises a substrate with a mounting surface and a transistor coupled to the mounting surface of the substrate. The transistor includes an active region formed in a substrate, the active region being bounded by an outer periphery, the active region including a set of input fingers, a set of output fingers, and a set of common fingers disposed within the substrate and oriented substantially parallel to one another. An input port is positioned outside of the outer periphery of the active region at a first longitudinal end of the sets of input, output, and common fingers and an output port is positioned outside of the outer periphery of the active region at a second longitudinal end of the sets of input, output, and common fingers. A first via connection is disposed at the outer periphery of the active region proximate the input port, the first via connection having a noncircular cross-section with a first major axis and a first minor axis, the first major axis having a first length, and the first minor axis having a second length that is less than the first length. A second via connection disposed at the outer periphery of the active region proximate the output port, the second via connection having the noncircular cross-section with a second major axis and a second minor axis, the second major axis having a third length, the second minor axis having a fourth length that is less than the third length, and the second major axis of the second via connection being oriented non-parallel to the first major axis of the first via connection.

Accordingly embodiments can include non-circular via connections in two-orientations that are placed along both the input and output sides of the active device region. On the input side, the major axis (e.g., long axis) of the non-circular via connection is oriented perpendicular to the long axis of the gate to minimize common-mode inductance. On the output side, the major axis of the non-circular via connection is oriented parallel to the longitudinal dimension of the gate to mitigate electromigration constraints. Accordingly, such a transistor layout may be suitably utilized in a two port circuit configuration, and can further achieve benefits in both die size and performance.

This disclosure is intended to explain how to fashion and use various embodiments in accordance with the invention rather than to limit the true, intended, and fair scope and spirit thereof. The foregoing description is not intended to be exhaustive or to limit the invention to the precise form disclosed. Modifications or variations are possible in light of the above teachings. The embodiment(s) was chosen and described to provide the best illustration of the principles of the invention and its practical application, and to enable one of ordinary skill in the art to utilize the invention in various embodiments and with various modifications as are suited to the particular use contemplated. All such modifications and variations are within the scope of the invention as determined by the appended claims, as may be amended during the pendency of this application for patent, and all equivalents thereof, when interpreted in accordance with the breadth to which they are fairly, legally, and equitably entitled.

What is claimed is:

1. A transistor comprising:
   an active region formed in a substrate, the active region being bounded by an outer periphery, the active region including a set of input fingers, a set of output fingers, and a set of common fingers disposed within the substrate and oriented substantially parallel to one another;
   an input port;
   an output port;
   a first via connection disposed at the outer periphery of the active region proximate the input port; and
   a second via connection disposed at the outer periphery of the active region proximate the output port, the second via connection having a noncircular cross-section with a second major axis and a second minor axis, the second major axis having a second major axis length, the second minor axis having a second minor axis length that is less than the second major axis length, wherein the second major axis is oriented parallel to a longitudinal dimension of the sets of input, output, and common fingers.

2. The transistor of claim 1 wherein the first via connection has the noncircular cross-section with a first major axis and a first minor axis, the first major axis having a first major axis length, and the first minor axis having a first minor axis length that is less than the first major axis length, and wherein the second major axis of the second via connection is oriented non-parallel to the first major axis of the first via connection.

3. The transistor of claim 2 wherein the second major axis of the second via connection is oriented perpendicular to the first major axis of the first via connection.

4. The transistor of claim 2 wherein the first major axis of the first via connection is oriented perpendicular to the longitudinal dimension of the sets of input, output, and common fingers.

5. The transistor of claim 2 wherein:
   the first major axis length of the first major axis of the first via connection is equal to the second major axis length of the second major axis of the second via connection; and
   the first minor axis length of the first minor axis of the first via connection is equal to the second minor axis length of the second minor axis of the second via connection.

6. The transistor of claim 1 wherein:
   the input port is positioned outside of the outer periphery of the active region at a first longitudinal end of the sets of input, output, and common fingers; and
   the output port is positioned outside of the outer periphery of the active region at a second longitudinal end of the sets of input, output, and common fingers.

7. The transistor of claim 1 further comprising a pair of electrically conductive interconnects coupled to the input port and to the input fingers of the transistor, wherein the first via connection is surrounded by the input port, the first pair of electrically conductive interconnects, and the outer periphery of the active region of the transistor.

8. The transistor of claim 1 further comprising a pair of electrically conductive interconnects coupled to the output port and to the output fingers of the transistor, wherein the second via connection is surrounded by the output port, the second pair of electrically conductive interconnects, and the outer periphery of the active region of the transistor.

9. The transistor of claim 1 wherein:
   the first and second via connections are electrically connected to the common fingers;
   the input port is electrically connected to the input fingers; and
   the output port is electrically connected to the output fingers.

10. The transistor of claim 1 wherein the first and second via connections extend through the substrate and connect to a common node of the transistor.

11. A transistor comprising:
    an active region formed in a substrate, the active region being bounded by an outer periphery, the active region including a set of input fingers, a set of output fingers, and a set of common fingers disposed within the substrate and oriented substantially parallel to one another;
    an input port;
    an output port;
    a first via connection disposed at the outer periphery of the active region proximate the input port, the first via connection having a noncircular cross-section with a first major axis and a first minor axis, the first major axis being oriented perpendicular to a longitudinal dimension of the sets of input, output, and common fingers, the first major axis having a first length, and the first minor axis having a second length that is less than the first length; and
    a second via connection disposed at the outer periphery of the active region proximate the output port, the second via connection having the noncircular cross-section with a second major axis and a second minor axis, the second major axis being oriented parallel to the longitudinal dimension of the sets of input, output, and common fingers, the second major axis having a third length, the second minor axis having a fourth length that is less than the third length, and the second major axis of the second via connection being oriented non-parallel to the first major axis of the first via connection, wherein the first and second via connections extend through the substrate and connect to a common node of the transistor.

12. The transistor of claim 11 wherein the second major axis of the second via connection is oriented perpendicular to the first major axis of the first via connection.

13. The transistor of claim 11 wherein:
    the input port is positioned outside of the outer periphery of the active region at a first longitudinal end of the sets of input, output, and common fingers; and
    the output port is positioned outside of the outer periphery of the active region at a second longitudinal end of the sets of input, output, and common fingers.

14. The transistor of claim 13 further comprising a first pair of electrically conductive interconnects coupled to the input port and to the input fingers of the transistor, wherein the first via connection is surrounded by the input port, the first pair of electrically conductive interconnects, and the outer periphery of the active region of the transistor.

15. The transistor of claim 13 further comprising a second pair of electrically conductive interconnects coupled to the output port and to the output fingers of the transistor, wherein the second via connection is surrounded by the output port, the second pair of electrically conductive interconnects, and the outer periphery of the active region of the transistor.

* * * * *